United States Patent [19]

Robba et al.

[11] 4,054,708
[45] * Oct. 18, 1977

[54] FILM OF PYROLYTIC GRAPHITE HAVING BI-DIRECTIONAL REINFORCING PROPERTIES

[75] Inventors: William A. Robba, Boulder, Colo.; Robert W. Froberg, Easton, Pa.

[73] Assignee: Pfizer Inc., New York, N.Y.

[*] Notice: The portion of the term of this patent subsequent to Aug. 19, 1992, has been disclaimed.

[21] Appl. No.: 579,667

[22] Filed: May 21, 1975

Related U.S. Application Data

[60] Division of Ser. No. 448,651, March 6, 1974, Pat. No. 3,900,540, which is a continuation of Ser. No. 202,385, Nov. 26, 1971, abandoned, which is a continuation-in-part of Ser. No. 154,228, June 17, 1971, abandoned, which is a continuation-in-part of Ser. No. 43,430, June 4, 1970, abandoned.

[51] Int. Cl.² ............ C01B 31/04; C03B 18/02; B29J 1/00
[52] U.S. Cl. ............ 428/220; 423/291; 423/345; 423/346
[58] Field of Search ............ 423/445, 448, 458, 291, 423/345, 346; 428/220

[56] References Cited

U.S. PATENT DOCUMENTS 3,900,540  9/1975  Robba et al. ............ 423/458 X

OTHER PUBLICATIONS

Higgs et al. "Research and Development on Advanced Graphite Materials" Tech. Report WADDTR61-72, 1964, pp. 1-25.
Chang "Studies on Effects of Deposition Conditions and Heat Treatment on the Properties of Pyrolytic Carbon" ORNL3764, 1965, pp. 1-10.
Presland et al., "Carbon" vol. 7. No. 1, 1969, pp. 1-8.
Kelly "Carbon" vol. 7, No. 6, 1969, pp. 699-700.

Primary Examiner—Edward J. Meros
Attorney, Agent, or Firm—Connolly and Hutz

[57] ABSTRACT

A thin film of substantially defect-free pyrolytic graphite, useful as a bi-directional reinforcing material, is formed by vapor deposition on an inert liquid substrate surface and separated therefrom. The substrate temperature is substantially below the melting point of the refractory material and the substrate surface is smooth and free of stress to enable formation of a substantially defect-free film. Thin films of other refractory materials can be made similarly by first forming a pyrolytic graphite film on the substrate, and then vapor depositing a film of refractory material on the pyrolytic graphite surface. The pyrolytic graphite and refractory material films are then separated from the substrate surface and then separated from each other. Various refractory film materials can be made including pyrolytic grahite; boron; silicon; and refractory carbides, borides and nitrides. For making pyrolytic graphite films, it is preferable to use tin as the substrate, at a temperature of about 1600-1800° C., at atmospheric pressure, a source gas consisting of methane and argon, helium, or hydrogen, and a film residence time on the substrate surface of about 0.16-2 minutes.

2 Claims, 3 Drawing Figures

FILM OF PYROLYTIC GRAPHITE HAVING BI-DIRECTIONAL REINFORCING PROPERTIES

CROSS REFERENCE TO RELATED APPLICATIONS

This application is a division of copending application Ser. No. 448,651 filed Mar. 6, 1974, now U.S. Pat. No. 3,900,540, which is a continuation of application Ser. No. 202,385 filed Nov. 26, 1971 and now abandoned which is a continuation in part of application Ser. No. 154,228 filed June 17, 1971 and now abandoned which is a continuation in part of application Ser. No. 43,430 filed June 4, 1970 and now abandoned.

BACKGROUND OF THE INVENTION

This invention relates to a unique method of producing thin films of refractory materials (characterized as those materials that at temperatures greater than 1000° C. do not decompose and retain their strength properties) that can be used as bi-directional reinforcing materials in lightweight-high strength composite materials. Current art relates to high strength-high modulus filaments or fibers produced by vapor deposition or pyrolysis which are used as uni-directional reinforcements for composite materials. Typical of these are boron filaments produced by vapor deposition of boron on fine tungsten wire, or carbon and graphite filaments produced by controlled pyrolysis of rayon or PAN fibers. These fibers, though strong and stiff, lend only uni-directional reinforcement; and, thus, present problems related to interlaminar shear and complex filament winding techniques.

This invention overcomes these disadvantages by producing the reinforcing material in the form of a film instead of filament, which film can be used in laminated structures over a wide size range, and by producing the film on a liquid substrate provides a large, smooth, flat surfce area from which the film can be continuously separated. The combination of the imperfection and stress-free liquid surface and a substrate surface temperature conducive to crystal mobility provides the means for producing a thin film whose properties approach that of currently available fiber or filament uni-directional reinforcements. If film structure is not adequate, due to deposition temperatures set by liquid substrate reactivity or vapor pressure, further annealing or stress annealing can be accomplished after the film is separated from the substrate.

SUMMARY OF THE INVENTION

Accordingly, it is an object of the present invention to prepare reinforcements similar to the uni-directional filament or fiber but with bi-directional properties and producible in large quantities on a continuous basis.

Another object of this invention is to provide a process for producing thin films or ribbons of refractory materials such as, but not limited to, pyrolytic graphite; silicon; boron; refractory carbides such as boron carbide and silicon carbide; refractory nitrides such as silicon nitride and boron nitride; and refractory borides. The thickness is controlled to obtain the desired characteristics for use in varied specific applications.

Another object is to provide a process which operates at temperatures considerably below the melting point of the refractory material being produced. In other words, the melting point or vapor pressure make it difficult, if not impossible, to produce these films from the liquid state. This invention permits the production at considerably lower temperatures.

Another object is to provide a process wherein the temperature of the liquid deposition substrate is controlled to obtain the optimum crystalline structure to maximize strength, modulus and other pertinent properties.

Yet another object of this invention is to provide a stress-free liquid deposition surface which results in a very smooth and substantially defect-free films. Other objects and mean for accomplishing them will appear hereinafter. The advantages of this invention will be readily apparent, to those knowledgeable in the art, from the following detailed description of the preferred embodiments thereof.

BRIEF DESCRIPTION OF THE DRAWING

Novel features and advantages of the present invention will become apparent to one skilled in the art from a reading of the following description in conjunction with the accompanying drawings wherein similar reference characters refer to similar parts and in which.

DETAILED DESCRIPTION OF THE INVENTION

Figure 1:
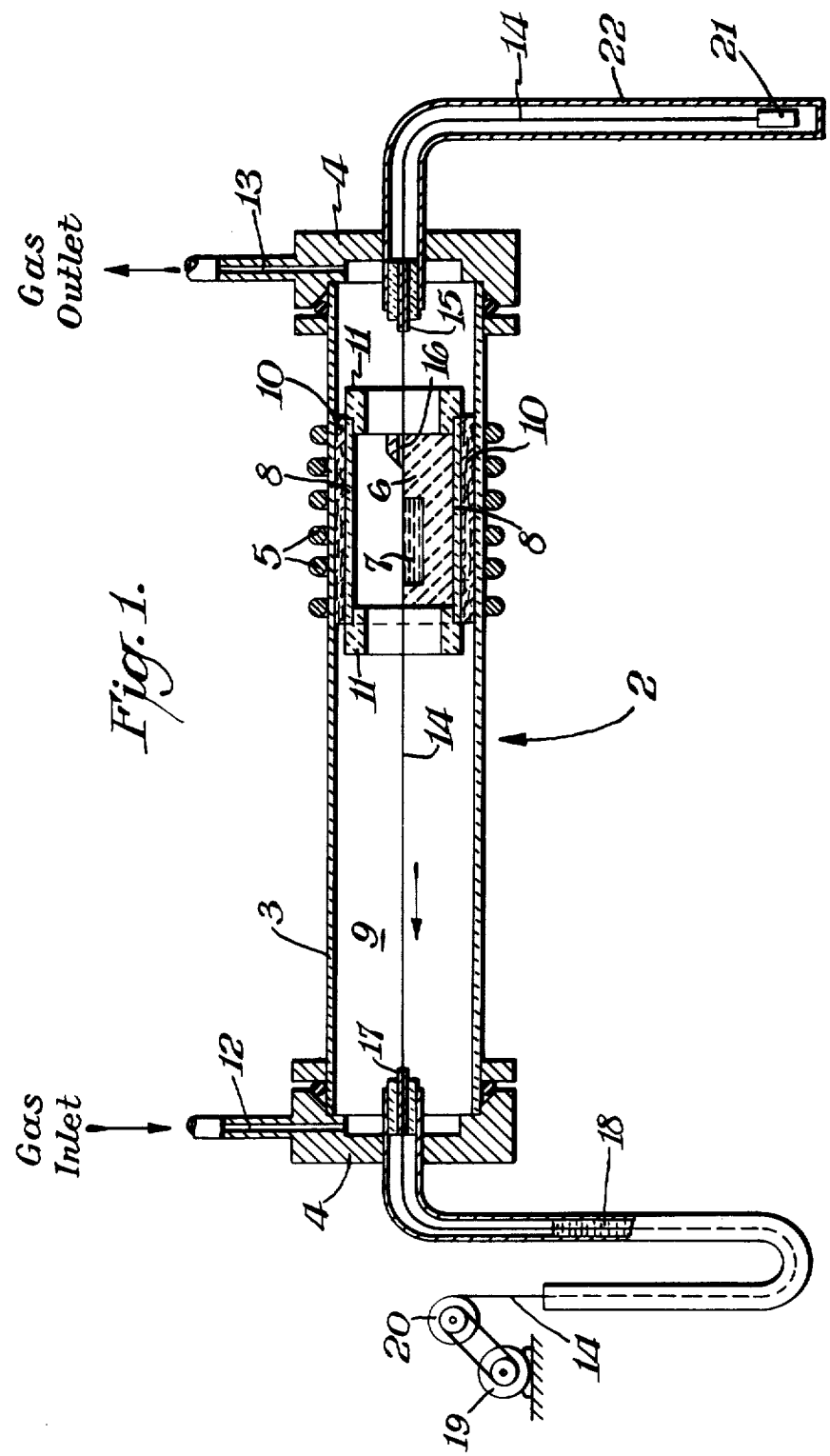
FIG. 1 is a front view in elevation of an apparatus for performing a method which is one embodiment of this invention.

According to the invention, a thin film of substantially defect-free pyrolytic graphite, having bi-directional reinforcing properties, is produced by forming from a source gas by vapor deposition a film of said material on a substantially smooth and stress-free surface of an inert liquid substrate, while maintaining the temperature of the liquid surface substantially below the melting point of the material, and separating said film from the liquid substrate of surface.

Also disclosed is a method of making a thin film of substantially defect-free, non-oxygen-containing refractory material which comprises: forming by vapor deposition a thin film of said material on the surface of a film of pyrolytic graphite, said graphite film being previously formed from a source gas comprising a mixture of a hydrocarbon gas and a diluent gas selected from the group consisting of helium, neon, argon, krypton, xenon, radon, hydrogen, and nitrogen by vapor deposition on the surface of an inert liquid substrate, said surface being substantially smooth and stress-free; while maintaining the temperature of said substrate selected from the group consisting of copper, gold, tin, silver, palladium, lead, antimony, platinum, and glass, substantially below the melting point of graphite; and separating said refractory film from said film of pyrolytic graphite.

It is, of course, critical to the process for producing the pyrolytic graphite and/or refractory films of other materials that the liquid substrate surface be substantially smooth and stress-free so that the film or films deposited thereon attains the required strength properties of a suitable bidirectional refractory reinforcing material. It is also preferable to operate the process at substrate surface temperatures considerably below the melting point of the pyrolytic graphite and/or other refractory material being produced. By reference to operating below the melting point of refractory materials, it is understood that this includes operating below the sublimation point of those materials not having melting points.

If film structure is not adequate due to deposition temperatures set by liquid substrate reactivity or vapor pressure, further annealing or stress annealing can be accomplished after the film is separated from the substrate.

The liquid substrate used must be liquid under the conditions of use, and must be inert to both the reactant source gas and the pyrolytic graphite product formed on its surface. Thus where pyrolytic graphite film is being made, typical inert liquid substrates that can be used, but not to limit other selections by anyone skilled in the art, are metals such as copper, gold, tin, silver, palladium, lead, antimony and platinum; and glass. Of course, it is understood that the substrate materials are only useful when liquid (i.e. at temperatures above their melting point and below their boiling point) and the choice of a particular substrate material to be used can be made by anyone skilled in the art to fit the particular process temperature used.

In the case of making films of pyrolytic graphite, any gas containing hydrogen and carbon can be used for preparing deposits of pyrolytic graphite, and the basic structure of the deposited material does not differ significantly by the use of different hydrocarbon gases (see P. L. Walker, Jr., *Chemistry & Physics of Carbon*, vol. 1, 1965, "The Formation of Carbon from Gases", particularly pp. 287–293). Thus, as is well known in the art, various hydrocarbon materials can be used to make pyrolytic graphite by pyrolysis such as paraffinic hydrocarbons, olefinic hydrocarbons, acetylenic hydrocarbons, and aromatic hydrocarbons; and substances that yield hydrocarbons and/or hydrogen and carbon on pyrolysis such as paraffin oil, fuel oil, furnace oil, coal tar, and many other hydrocarbon materials (see *Carbon*, vol. 6, 1968, Pergamon Press, "Pyrolytic Carbons Deposited in Fluidized Beds at 1200° to 1400° C. from Various Hydrocarbons", pp. 603–616, and "*Thermal Decomposition of Biphenyl and Naphthalene in a Flow System*", pp. 419–20; *Carbon*, vol. 4, 1966, Pergamon Press, "Carbons Obtained by Thermal and Catalytic Cracking of Coal Tars", pp. 193–99). Such hydrocarbons as methane, ethane, propane, acetylene, naphthalene, benzene, and toluene are used often simply because of their ready availability and relative inexpensiveness. A limitation on what hydrocarbons can be used herein is that they do not produce substances that would interfere with the formation of the pyrolytic graphite film by reacting with it or the liquid substrate. Thus for example, the hydrocarbon should not contain any halogen or oxygen substituents, and preferably the hydrocarbon yields hydrogen and carbon when pyrolyzed.

As was noted previously, the basic structure of the vapor-deposited pyrolytic graphite does not vary significantly by using different source gas hydrocarbon materials; however, it is well known that the rate of deposition will depend on the hydrocarbon gas concentration in the source gas, and indirectly on the type of hydrocarbon material used. The rate of deposition, and therefore the resulting film thickness of the pyrolytic graphite, can be modified by incorporating in the hydrocarbon source gas any diluent gas well known in the art which is inert to the reactants, pyrolysis products, and the liquid substrate material (see Carbon, vol. 6, 1968, Pergamon Press, "Deposition of Pyrolytic Carbon in the Pores of Graphite Bodies", pp. 397–403). Thus, the diluent gas can be typically helium, neon, argon, krypton, xenon, radon, hydrogen, nitrogen, and any other gas that is inert to the reaction as described above.

Specifically in carrying out the invention where the refractory material is pyrolytic graphite, the temperature of said substrate is from about 900°–2100° C., the residence time of the deposited graphite film on said substrate surface is about 0.16–5 minutes, and the system pressure during said vapor deposition is about 5–850 mm Hg. Very low pressures are not preferred due to high vaporization rates of the liquid substrate. Pressures much above atmospheric can be used, but this would only require more expensive equipment in carrying out the invention. If necessary, the recovered film can be annealed or stress annealed to improve its structure and strength at a temperature of about 2600°–3200° C.

Preferably, the substrate is tin; the source gas for making pyrolytic graphite comprises a mixture of methane and a diluent gas such as argon, helium, or hydrogen; the temperature of the tin is about 1600°–1800° C.; the system pressure is about 760 mm Hg; and the residence time is about 0.16–2 minutes. Of course, residence time is calculated by dividing deposition zone length by film removal rate.

In the case of making films of refractory materials other than pyrolytic graphite, it is found necessary to use a pyrolytic graphite thin film as the deposition surface for the refractory film which can be accomplished by first forming by vapor deposition a thin film of pyrolytic graphite on the liquid substrate surface, and then vapor depositing by techniques well known by anyone skilled in the art a thin film of the refractory material of interest on the surface of the pyrolytic graphite film thus made, and then separating both films from each other. If it is desired to form the refractory material film on the surface of the pyrolytic graphite film while the graphite film is still in contact with a liquid substrate surface, the prior formation of the vapor-deposited film of pyrolytic graphite is necessary to prevent contact between the refractory material film and the substrate which, particularly in the case of liquid metal substrates, could possibly result in the refractory material reacting with or sticking to the substrate surface, thereby producing refractory films possessing poor quality and strength. The intermediate pyrolytic graphite films permits the formation of good quality refractory films useful as bi-directional reinforcing materials, which are easily separated together with the pyrolytic graphite film from the substrate surface, and then separated from each other.

By utilizing vapor deposition techniques well known by anyone skilled in the art, it is made possible by the method herein disclosed to form thin films of a wide variety of refractory materials useful as bi-directional reinforcing materials. Thus for example according to C. F. Powell's survey of vapor deposition techniques for a great variety of materials (see *Vapor Deposition*, 1966, edited by C. F. Powell, J. H. Oxley, and J. M. Blocker, Jr.; associated with Battelle Memorial Institute, Columbus, Ohio; sponsored by the Electrochemical Society, Inc., New York, New York; published by John Wiley and Sons, Inc.; "Chemically Deposited Nonmetals", Chapter 11, pp. 343–420), typical thin film refractory materials that can be made by the method disclosed herein are boron; silicon; refractory carbides, borides, and nitrides of silicon, titanium, zirconium, hafnium, vanadium, niobium, and tantalum; refractory carbides and borides of chromium, molybdenum, tungsten, and iron; refractory carbides and nitrides of beryllium and boron; refractory aluminum carbides and thorium carbides; certain mixed carbides; refractory aluminum borides and nitrides; and refractory cobalt borides and nickel borides. Of course, a limitation on the type of thin film refractory material that can be made by the method is that neither the reactants used to make the refractory material nor the product itself reacts with pyrolytic graphite. Therefore, for example, refractory oxide films cannot be made by this process, wherein a pyrolytic graphite intermediate film is utilized.

Similarly to the process for making pyrolytic graphite thin films previously described, the residence time of the deposited refractory material film on said pyrolytic graphite film is about 0.16-5 minutes, and the system pressure during vapor deposition is about 5-850 mm Hg. The system temperature during deposition depends on the particular refractory material film being deposited. However, it must be lower than the melting point of pyrolytic graphite so as to permit the graphite film to remain solid. Also, where the refractory film is deposited on the surface of the pyrolytic graphite film while the latter film is still in contact with the liquid substrate surface, it is additionally necessary that the deposition temperature be above the melting point of the particular substrate used to keep it liquid during the deposition process. This of course is essential to the proper formation of a good quality refractory film on the pyrolytic graphite film and for allowing the separation of the two films from the substrate surface and then from each other. Thus where a thin film of pyrolytic graphite previously formed by the process described herein is used as the deposition surface for a refractory material film to be formed by vapor deposition on the surface of the graphite film, after the graphite film has been separated from the liquid substrate surface and removed to a separate deposition zone for making the refractory material film, there is no temperature limitation with respect to substrate melting point since there is no liquid substrate deposition surface. The pyrolytic graphite thin film made by the process described herein provides the deposition surface for making the refractory material films described herein, and need not be in contact with a liquid substrate surface when making said refractory material film. However, poor quality refractory material films will result if the deposition surface used is that of a massive solid substrate surface, and not that of the thin film pyrolytic graphite made by the process described herein.

According to the specific refractory material thin film to be made by the process described herein, anyone skilled in the art can make the proper choice of deposition temperature, source gas and diluents necessary to obtain said thin refractory material film. For example in making boron films, the preferred boron source gas can be a boron trihalide (e.g. boron trichloride or tribromide), boron hydrides (e.g. diborane), or organoboron compounds (e.g. trimethylboron); an inert diluent gas — preferably hydrogen — is used; and the deposition temperature is about 600°-1500° C.

To illustrate the making of refractory carbides, to make boron carbide films the same boron source gases and diluents above can be used in combination with a hydrocarbon gas similar to those used to make pyrolytic graphite; however, the deposition temperature should be preferably about 1500°-2000° C. Alternately, a boron source gas can be used without a hydrocarbon source gas and at these higher temperatures the boron that is vapor deposited at the surface will diffuse into the graphite film to form a distinct film of substantially boron carbide. Also, note that nitrogen should not be used as a diluent for making boron and boron carbide thin films since this leads to the formation of boron nitride. Silicon carbide is preferably vapor-deposited at about 1100°-1800° C. using a silicon source gas (e.g. silicon tetrachloride, methyl trichlorosilane, diethyldichlorosilane), a hydrocarbon source gas (such as used for making pyrolytic graphite films), and a diluent. Similarly, other carbides can be made using the appropriate source gases and temperatures well known to anyone skilled in the art.

Pure silicon thin films can be made by vapor-deposition using the above silicon source gases and diluents, but without a hydrocarbon source gas, and at a deposition temperature about 800°-1100° C. Above 1100° C. the silicon has a tendency to diffuse into the pyrolytic graphite film.

To illustrate the making of refractory nitrides, boron nitride is made for example by vapor-deposition from borazole ($B_3N_3H_6$), beta-trichloroborazole ($B_3N_3H_3Cl_3$), or a mixture of boron chloride and a nitrogen-containing gas (e.g. $N_2$ or $NH_3$) at a deposition temperature of about 700°-1600° C. Silicon nitride is made by vapor deposition for example from silicon tetrabromide and dry ammonia gas at a temperature about 930°-1000° C. Of course additional diluent gases such as hydrogen can also be used. Similarly other nitrides can be made using the appropriate source gases and temperatures well known to anyone skilled in the art.

To illustrate the making of refractory borides, to make aluminum boride films by vapor deposition preferably a mixture of aluminum trichloride and boron trichloride are used as the source gases at a temperature of about 1000° C. Silicon boride films are made by vapor deposition using a mixture of silicon tetrachloride and boron trichloride at a temperature about 1000°-1300° C. Preferably hydrogen is used as a diluent. Similarly other borides can be made using the appropriate source gases and temperatures well known to anyone skilled in the art.

Depending on the film material to be produced, anyone skilled in the art can make the choice of substrate, temperature, pressure, and residence time of the film to obtain the desired film. One embodiment of the invention comprises a controlled atmosphere furnace, preferably electrically heated, a source of vapor that will form the deposit, a liquid or molten surface area whose temperature is maintained at sufficient level to maintain the liquid state and permit deposition of a film of the desired material upon it, and a variable speed, motor-gear assembly with which the film is continuously removed from the substrate. Typically, such a furnace would be horizontal and consist of a number of zones, one for producing or introducing the vapor; a preheat zone; a reaction or deposition zone; a zone for film separation; a zone for further heat or chemical treatment, if required; the application of a backing to the ribbon; and, finally, a zone for winding or packaging.

The following description represents a preferred embodiment for carrying out the invention.

Figure 2:
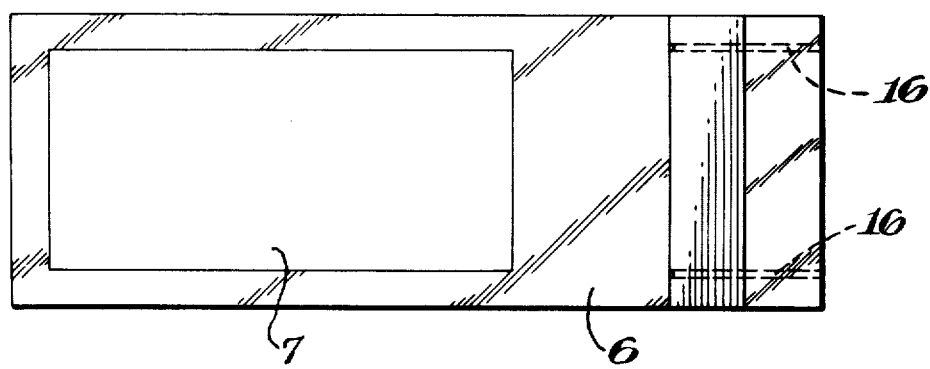
FIG. 2 is a plan view of the graphite boat component shown in FIG. 1.
Figure 3:
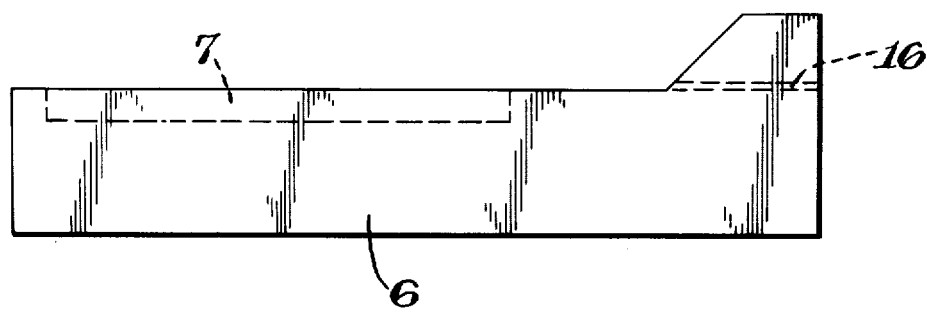
FIG. 3 is a front view of the graphite boat component shown in FIG. 2.

FIG. 1 is a sectional view of the deposition apparatus employing our invention, and FIGS. 2 and 3 are enlarged sketches of the graphite boat which is also employed in the deposition apparatus of FIG. 1.

In FIG. 1, the deposition apparatus is shown generally at 2 which comprises a quartz tube 3 supported between two water cooled brass heads 4. A section of the quartz tube is surrounded by an RF heating coil 5. A graphite boat 6 containing a pool of liquid substrate 7 is inductively heated by a pyrolytic graphite susceptor 8, insulated by a wrapping of carbon felt 10. Additonal insulation is provided to the hot zone by oriented rings of pyrolytic graphite 11 attached to the two ends of the susceptor. Reactant gases which are premixed, pass into the quartz tube through an opening 12 some distance away from the hot liquid substrate pool 7. Upon contacting the hot substrate surface, the gases decompose so as to form a film of the desired material upon the substrate surface. Product gases and unreacted feed gas pass on through the quartz tube and exit through a second opening 13 and are pulled into a vacuum pump or exhausted to the atmosphere.

During the process of deposition, two paralled carbon fibers 14 are passed over the surface of the liquid substrate 7 at a predetermined speed. The fibers are kept in alignment by passing through two capillary guide tubes 15 at the point at which they enter the quartz tube. Additional alignment of the carbon fibers 14 is provided by two holes or slots 16 in the graphite boat 6 and by two additional capillary tubes 17 placed in the water cooled head 4 at the exit end of the quartz tube 3.

The carbon fibers are passed through a mercury-filled U-tube 18 when it is necessary to maintain a vacuum within the quartz tube 3. A variable speed motor 19 is used to turn a take-up reel 20 so that the fibers 14 can be pulled at the desired rate.

The carbon fibers are kept in constant tension by two hanging weights 21 which hang free in a sealed tube 22.

As the carbon fibers 14 pass over the liquid substrate surface 7, the deposited film attaches itself to the moving fibers and moves off the substrate surface. As fresh substrate surface is exposed by the moving film, it is covered by newly deposited material which attaches itself to the previously deposited film as well as the two moving fibers. As the result of simultaneously moving the film and depositing a new film on the substrate surface, a continuous ribbon of deposited film emerges from the susceptor 8 and moves into the empty section of the quartz tube 9.

If desired, the pressure within the quartz tube may be increased to above atmospheric pressure; and the ribbon of film may be pulled through an appropriate opening in the apparatus, separated from the carbon fibers, and wound directly onto a take-up drum.

In addition, if desired, the carbon fibers may be formed into two closed loops and reused continuously.

In addition, if desired, additional treatments such as heat treating or coating with the same material or coating with a different material may be carried out on the ribbon of film before or after it is separated from the carbon fibers and before it is wrapped on the take-up reel.

When refractory material thin films other than pyrolytic graphite are to be made, the film of pyrolytic graphite formed by vapor deposition is not immediately removed from the liquid substrate surface. The conditions are adjusted (e.g., source gas, pressure, temperature, etc.) to permit the vapor-deposition of a thin film of refractory material on the exposed pyrolytic graphite surface; then the two films are separated simultaneously from the substrate surface and separated from each other. Alternately, the pyrolytic graphite film can be separated from the liquid substrate surface, removed from this first zone of deposition, transported to a second zone of deposition, wherein the refractory material film can be formed by vapor deposition on the graphite film surface and afterwards separated therefrom. Thus in this manner, both a pyrolytic graphite film and a refractory material film can be recovered. Also, if desired, the refractory material film alone can be recovered and the pyrolytic graphite film can be reused to provide a deposition surface again for additional vapor-deposition of refractory material films.

Typical tensile strengths for films of pyrolytic graphite and other refractory materials made by this invention are observed to be about 100,000 to over 200,000 psi, with Young's modulus measured at about 20 to over 50 million psi.

The thickness of the film produced of course depends on many conditions of which film removal rate is probably most important. Typical thicknesses range from 1–25 microns, but are not limited to this range.

Film deposition zone lengths typically are, but not limited to, 1–3 inches.

The following examples are provided for illustrative purposes and should not be interpreted as limiting the invention, the scope of which is defined by the appended claims.

Note that the following examples, the conditions given therein refer to the preferred embodiment of the invention shown in FIGS. 1, 2, and 3 and described herein.

Also, times refer to residence times and gas flows are in cubic feet per hour (CFH).

EXAMPLE I

A film of pyrolytic graphite is made by the method described in this invention using a liquid tin substrate at a temperature of 1725° C., a system pressure of 740–760 mm Hg, and a residence time for the film on the substrate surface of 0.25 minutes. The source gas for depositing the pyrolytic graphite consists of argon and methane, delivered to the deposition chamber at 14 CFH and 0.5 CFH, respectively. Similar results are obtained at a temperature of about 1800° C.

EXAMPLE II

A film of pyrolytic graphite is made as in Example I except that the temperature is 1700° C., the pressure is 784 mm Hg, and the residence time is 0.16–0.25 minutes. Similar results are obtained at a pressure of about 850 mm Hg using silver instead of tin.

EXAMPLE III

A film of pyrolytic graphite is made as in Example I except that the temperature is 1710° C., the pressure is 700 mm Hg, and the residence time is 1 minute. Similar results are obtained at a temperature of 1600° C. using hydrogen, neon, krypton, xenon, radon, and nitrogen, respectively, instead of argon.

EXAMPLE IV

Similar results are obtained following the procedure described in Example I using palladium, copper, glass, and platinum, respectively, instead of tin, and the temperature is 2100° C.

EXAMPLE V

The film produced is pyrolytic graphite. The vapor is methane with an argon diluent. The liquid substrate used is refined gold.

| | |
|---|---|
| Temp.: 1630° C. | Time: 2 minutes |
| Pressure: 600 mm Hg | Flow: 9 CFH Argon; 0.1134 CFH CH₄ |

EXAMPLE VI

A pyrolytic graphite film is produced from methane and helium diluent on a refined gold substrate.

| | |
|---|---|
| Temp.: 1710° C. | Time: 1.0 minutes |
| Pressure: 600 mm Hg | Flow: 6 CFH Argon; 0.182 CFH Methane |

EXAMPLE VII

A film is produced as in Example V, then stress annealed at 2600°–3200° C. to increase strength and modulus.

| | |
|---|---|
| Time: 6 minutes | Stress: Load-50 gms. (approx. 1500 psi) |

EXAMPLE VIII

A film of pyrolytic graphite is produced from methane and argon diluent on a liquid tin substrate.

| | | |
|---|---|---|
| Temp.: 1700° C. | Time: 2 minutes | Pressure: 710 mm Hg |
| Flow: Methane 0.9 CFH - Argon 29.5 CFH | | |

Similar results are obtained at a temperature of 900° C., using lead and antimony, respectively, instead of tin.

EXAMPLE IX

A film of pyrolytic graphite is produced on a liquid tin substrate.

| | |
|---|---|
| Temp.: 1700° C. | |
| Pressure: 710 mm Hg | Methane Flow: 0.50 CFH |
| Argon Flow: 12 CFH | Time: 3.25 minutes |
| Film Length: 5¼″ | Length of Deposition Zone: 1⅛″ |

Similar results are obtained with a time of 5 minutes.

EXAMPLE X

A film of pyrolytic graphite is produced as in Example IX

| | |
|---|---|
| Length of Film: 23″ | Length of Deposition Zone: 1″ |

EXAMPLE XI

The film produced is pyrolytic graphite on a liquid tin substrate.

| | |
|---|---|
| Temp.: 1630° C. | Time: 5 minutes |
| Argon Flow: 9 CFH | Pressure: 460 mm Hg |
| Methane Flow: 0.172 CFH | |

EXAMPLE XII

A pyrolytic graphite film is made on a liquid tin substrate as in Example XI at a pressure of about 5 mm Hg, and similar results are obtained.

EXAMPLE XIII

Similar results are obtained following the procedure of Example IX, using acetylene, benzene, propane, ethane, cyclohexane, toluene, and naphthalene, respectively, instead of methane.

The following examples illustrate the preparation of thin films of refractory materials other than pyrolytic graphite, wherein a thin film of pyrolytic graphite previously made by the method described herein provides the deposition surface for forming the refractory material thin film.

EXAMPLE XIV

A film of Boron-carbide is prepared under the following conditions:

| | |
|---|---|
| Temperature: 1680° C. | Substrate: Tin |
| Gas flow: Argon: 41 CFH | Deposition Time: 2 min. |
| Methane: 1.95 CFH | Pressure: 760 mm Hg. |
| Boron Trichloride: 0.175 CFH | |

Procedure: Under a protective atmosphere of Argon, the metal substrate is heated to 1680° C. and stabilized at that temperature. Methane is admitted to the gas inlet and within 1 minute a graphite film is deposited over the liquid metal surface. Boron trichloride is added to the methane/argon gas mixture and a Boron-carbide film is co-deposited upon the existing pyrolytic graphite film. The pyrolytic graphite and boron carbide films are separated from the substrate surface and then separated from each other.

Similar results are obtained using glass, copper, gold, palladium, platinum and silver instead of tin at a temperature of 1850° C.

EXAMPLE XV

A film of Boron-carbide is prepared under the following conditions:

| | |
|---|---|
| Temperature: 1710° C. | Substrate: Tin |
| Gas Flow: Argon: 41 CFH | Deposition Time: 4 min. |
| Methane: 1.95 CFH | Pressure: 200 mm Hg. |
| Boron Trichloride: 0.175 CFH | |

Procedure: Under a protective atmosphere of Argon, the metal substrate is heated to 1710° C. and stabilized at that temperature. Methane is admitted with the Argon for 3 minutes and a pyrolytic graphite film is formed on the liquid metal surface. The Methane is shut off and boron trichloride is admitted for one minute after which it is shut off.

After cooling, two distinct films being substantially boron carbide and pyrolytic graphite are discovered which are separated from the substrate surface and from each other and individually examined. The initial pyrolytic graphite film is clean and appears to be of the usual good quality. The boron-carbide film is very stiff and quite unlike the graphite film in appearance. Tensile tests of these films showed that the Boron-carbide film has a modulus of 45 million psi while the graphite film has a modulus of 17 million psi. This distinctly different stress-strain behavior is conclusive proof that two entirely different films are formed in this deposition process. Each of the films is about 0.15 mils (or about 3.8 microns) thick and easily removed from the metal substrate.

EXAMPLE XVI

A film of silicon-carbide is prepared under the following conditions:

| Temperature: 1700° C. | Substrate: Tin |
|---|---|
| Gas Flow: Argon: 12.1 CFH | Deposition Time: 3 min. |
| Methane: 1.8 CFH | Pressure: 760 mm Hg. |
| Hydrogen: 1.0 CFH | |

Procedure: Under a protective atmosphere of Argon, the metal substrate is heated to 1700° C. and stabilized at that temperature. A flow of hydrogen is admitted to the Argon gas and a flow of Methane is passed through a bath of methyltrichlorosilane and admitted to the Argon-hydrogen gas stream.

A solid film of silicon carbide is formed on the metal surface, having surface defects which result in poor quality and low strength properties.

EXAMPLE XVII

A film of silicon-carbide is prepared under the following conditions:

| Temperature: | 1700° C. | Substrate: Tin |
|---|---|---|
| Gas Flow: | Argon: 12.1 CFH | Deposition Time: 3 min. |
| | Methane: 1.8 CFH | Pressure: 760 mm Hg. |

Procedure: Under argon, the metal is heated to 1700° C. and stabilized at that temperature. A flow of methane is admitted to the inlet and a pyrolytic graphite film is deposited on the liquid metal substrate within 1 minute. The methane is then diverted through a saturation bath of methyl trichlorosilane and passed into the reactor, resulting in the deposition of a film of silicon carbide upon the existing graphite film. Both films are separated from the substrate surface and then separated from each other.

Similar results are obtained using hydrogen, neon, krypton, xenon, and radon instead of argon.

EXAMPLE XVIII

A film of boron nitride is formed by first masking the tin metal substrate with a pyrolytic graphite film as in previous examples, then depositing a second film from Beta-trichloroborazole ($B_3N_3H_3Cl_3$) using argon carrier gas.

| Temperature: 1200° C. | Substrate: Tin |
|---|---|
| Gas Flow: Argon: 41 CFH | Deposition Time: 3¼ min. |
| | Pressure: 760 mm Hg. |

Procedure: After a graphite film is formed on the metal surface, the methane is shut off and part (0.5 CFH) of the argon stream is saturated with $B_3N_3H_3Cl_3$ and admitted to the reactor. Three minutes are allowed to deposit the graphite film and approximately ¼ minute for the boron nitride. Two distinct films of pyrolytic graphite and boron nitride are produced which are easily separated from the liquid metal substrate, and then from each other.

Similar results are obtained using lead or antimony instead of tin.

EXAMPLE XIX

A film of silicon nitride is formed using a procedure similar to Example XVIII but lowering the temperature to 1000° C. after formation of the protective pyrolytic graphite film and depositing silicon nitride under the following conditions:

| Temperature: 1000° C. | Substrate: Tin |
|---|---|
| Gas Flow: Argon: 41 CFH | Deposition Time: 4 min. |
| | Pressure: 760 mm Hg. |

Procedure: The reactor is stabilized at 1000° C. and a mixture of dry ammonia and silicon tetrabromide is introduced with the argon by saturating a flow (0.5 CFH) of ammonia with silicon tetrabromide. Two distinct films of pyrolytic graphite and silicon nitride are produced which are easily removed from the metal substrate, and then separated from each other.

Similar results are obtained by vapor depositing the film of silicon nitride on the pyrolytic graphite film, while the graphite film is no longer in contact with a liquid substrate surface and has been removed for said nitride film deposition to a separate deposition chamber.

EXAMPLE XX

A film of boron is made by following the procedure of Example XV, except that the deposition temperature is 800° C. and the deposition time for the boron film is increased from 1 minute to 3 minutes.

EXAMPLE XXI

A film of silicon is made by first forming a thin film of pyrolytic graphite according to the procedure described in Example I. The temperature is then lowered to 900° C. and a gas mixture comprising silicon tetrachloride and hydrogen is admitted to the gas inlet to one deposition apparatus resulting in the formation of a film of silicon. Both films are separated from one substrate and then from each other.

EXAMPLE XXII

A film of aluminum boride is made by first forming a thin film of pyrolytic graphite according to the procedure described in Example I. The temperature is then lowered to 1000° C. and a gas mixture comprising boron trichloride, aluminum trichloride, and hydrogen is admitted to the gas inlet to one deposition apparatus resulting in the formation of a film of aluminum boride upon the existing pyrolytic graphite film. Both films are separated from the substrate surface and then from each other.

EXAMPLE XXIII

A film of silicon boride is made by following the procedure of Example XXII, except that silicon tetrachloride is used instead of aluminum trichloride.

EXAMPLE XXIV

Refractory boride films of titanium, zirconium, hafnium, vanadium and chromium, respectively, are made similarly to the procedure described in Example XXII, by substituting the corresponding metal chloride source gas for aluminum trichloride and vapor depositing the boride film at the appropriate deposition temperature.

EXAMPLE XXV

Refractory carbide films of titanium, zirconium, hafnium, vanadium, and chromium, respectively, are made similarly to the procedure described in Example XIV, by substituting the corresponding metal chloride source gas for boron trichloride, adding a hydrogen diluent, and vapor depositing the carbide film at the appropriate deposition temperature.

EXAMPLE XXVI

Refractory nitride films of titanium, hafnium, vanadium, and aluminum, respectively, are made similarly to the procedure described in Example XIX, by substituting the corresponding metal chloride source gas for silicon tetrabromide, substituting a nitrogen-hydrogen gas mixture for ammonia, and vapor depositing the nitride film at the appropriate deposition temperature.

What is claimed is:

1. An unsupported film of pyrolytic graphite having a thickness of from about 1 to 25 microns made by the process which comprises: maintaining the temperature of an inert liquid substrate selected from the group consisting of copper, gold, tin, silver, palladium, lead, antimony, platinum and glass below the melting point of graphite; introducing a premixed source gas comprising a mixture of a hydrocarbon gas and a diluent gas selected from the group consisting of helium, neon, argon, krypton, xenon, radon, hydrogen and nitrogen at a distance above the surface of said liquid substrate, said surface being substantially smooth and stress-free, whereby said hydrocarbon gas decomposes upon contacting said surface to form a pyrolytic graphite film thereon; and separating said film from said surface.

2. The film of claim 1 wherein said film is in the form of a ribbon.

* * * * *